US009929216B2

(12) United States Patent
Liu et al.

(10) Patent No.: US 9,929,216 B2
(45) Date of Patent: Mar. 27, 2018

(54) PROCESSES FOR FABRICATING ORGANIC X-RAY DETECTORS, RELATED ORGANIC X-RAY DETECTORS AND SYSTEMS

(71) Applicant: General Electric Company, Schenectady, NY (US)

(72) Inventors: Jie Jerry Liu, Niskayuna, NY (US); Gautam Parthasarathy, Niskayuna, NY (US); Ri-An Zhao, Niskayuna, NY (US); Kwang Hyup An, Rexford, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/084,855

(22) Filed: Mar. 30, 2016

(65) Prior Publication Data
US 2017/0148853 A1 May 25, 2017

Related U.S. Application Data

(63) Continuation-in-part of application No. 14/949,972, filed on Nov. 24, 2015.

(51) Int. Cl.
*H01L 27/30* (2006.01)
*H01L 51/44* (2006.01)
(Continued)

(52) U.S. Cl.
CPC .......... *H01L 27/308* (2013.01); *G01T 1/2018* (2013.01); *H01L 51/0035* (2013.01);
(Continued)

(58) Field of Classification Search
CPC ............ G01T 1/2018; H01L 2251/301; H01L 2251/303; H01L 27/308; H01L 51/0035;
(Continued)

(56) References Cited

U.S. PATENT DOCUMENTS 6,303,943 B1   10/2001   Yu et al.
6,489,044 B1 * 12/2002   Chen .................. H01L 51/0003
                                                                136/243
(Continued)

FOREIGN PATENT DOCUMENTS

WO        2007017475 A1      2/2007

OTHER PUBLICATIONS

Yoo et al., "Integrated organic photovoltaic modules with a scalable voltage output", Appl. Phys. Lett., vol. 89, 2006, 4 Pages.
(Continued)

*Primary Examiner* — Mark R Gaworecki
(74) *Attorney, Agent, or Firm* — John P. Darling

(57) ABSTRACT

A process for fabricating an organic x-ray detector is presented. The process includes forming a layered structure that includes disposing a first electrode layer on a thin film transistor array, disposing an organic photoactive layer on the first electrode layer and disposing a second electrode layer on the organic photoactive layer. The organic photoactive layer includes a fullerene or a fullerene derivative having a carbon cluster of at least 70 carbon atoms. The process further includes disposing a scintillator layer on the layered structure at a temperature greater than 50 degrees Celsius. An organic x-ray detector fabricated by the process is further presented. An x-ray system including the organic x-ray detector is also presented.

14 Claims, 5 Drawing Sheets

(51) Int. Cl.
  *H01L 51/00* (2006.01)
  *G01T 1/20* (2006.01)
  *H01L 51/42* (2006.01)

(52) U.S. Cl.
  CPC ...... *H01L 51/0036* (2013.01); *H01L 51/0046* (2013.01); *H01L 51/0047* (2013.01); *H01L 51/4253* (2013.01); *H01L 51/44* (2013.01); *H01L 51/448* (2013.01); *H01L 2251/301* (2013.01); *H01L 2251/303* (2013.01)

(58) Field of Classification Search
  CPC ............. H01L 51/0036; H01L 51/0046; H01L 51/0047; H01L 51/4253; H01L 51/44; H01L 51/448
  See application file for complete search history.

(56) References Cited

U.S. PATENT DOCUMENTS

| | | |
|---|---|---|
| 7,180,075 B2 | 2/2007 | Brabec et al. |
| 7,906,797 B2 | 3/2011 | Hummelen et al. |
| 8,637,831 B2 | 1/2014 | Hayden et al. |
| 8,809,796 B2 | 8/2014 | Jung |
| 8,822,930 B2 | 9/2014 | Soukal et al. |
| 8,822,980 B2 | 9/2014 | Hayashi et al. |
| 2004/0113088 A1 | 6/2004 | Brabec et al. |
| 2008/0023638 A1 | 1/2008 | Starman et al. |
| 2009/0026379 A1 | 1/2009 | Yaegashi et al. |
| 2011/0024642 A1* | 2/2011 | Tredwell ............... G01T 1/2018 250/370.09 |
| 2012/0267539 A1 | 10/2012 | Shinba et al. |
| 2013/0048866 A1* | 2/2013 | Nishino ................ G01T 1/2018 250/366 |
| 2014/0000716 A1* | 1/2014 | Eu ....................... H01L 51/0036 136/263 |
| 2014/0042411 A1* | 2/2014 | Fukuzaki ................ C07B 63/00 257/40 |
| 2014/0225094 A1 | 8/2014 | Fraboni et al. |
| 2014/0263945 A1* | 9/2014 | Huang .................. H01L 51/428 250/200 |
| 2015/0034910 A1 | 2/2015 | Parthasarathy et al. |
| 2015/0060676 A1 | 3/2015 | Couture et al. |
| 2015/0187837 A1 | 7/2015 | Zhao et al. |

OTHER PUBLICATIONS

Agostinelli et al., "A polymer/fullerene based photodetector with extremely low dark current for x-ray medical imaging applications", Applied Physics Letters, 2008, 4 pages.

Chen et al., "Recent Progress in Polymer Solar Cells: Manipulation of Polymer:Fullerene Morphology and the Formation of Efficient Inverted Polymer Solar Cells", Advanced Materials, vol. 21, 2009, pp. 1434-1449.

Kumar et al., "Origin of Radiation-Induced Degradation in Polymer Solar Cells", Adv. Funct. Mater, 2010, vol. 20, pp. 2729-2736.

Kingsley et al., "Stability of x-ray detectors based on organic photovoltaic devices", Journal of Selected Topics in Quantum Electronics, IEEE Journal, vol. 16, No. 6, 2010, pp. 1770-1775.

Kokubu et al., "Vertical phase separation of conjugated polymer and fullerene bulk heterojunction films induced by high pressure carbon dioxide treatment at ambient temperature",Phys. Chem. Chem. Phys., vol. 14, 2012, pp. 8313-8318.

Apaydina et al., "Optimizing the organic solar cell efficiency: Role of the active layer thickness", Solar Energy Materials and Solar Cells, vol. 113, Jun. 2013, pp. 100-105.

Gelinck et al., "X-ray imager using solution processed organic transistor arrays and bulk heterojunction photodiodes on thin, flexible plastic substrate", Organic Electronics, vol. 14, Issue 10, Oct. 2013, pp. 2602-2609.

Paez-Sierra et al., "Fabrication of an x-ray detector based on molecular plastic electronics", Proc. SPIE 9185, Organic Field-Effect Transistors XIII; and Organic Semiconductors in Sensors and Bioelectronics VII, 91851P. vol. 9185, Oct. 7, 2014, 7 Pages.

Zhang, et al., "Vertical phase separation in bulk heterojunction solar cells formed by in situ polymerization of fulleride", Scientific Reports 4, 2014, 8 Pages.

Arca, "Organic photodiodes for industrial sensing and medical imaging", Technical university of munich Chair of nanoelectronics, 2014,128 pages.

Liu et al., "Processes for fabricating organic x-ray detectors, related x-ray detectors and systems",Pending U.S. Appl. No. 14/949,972; Filing Date:Nov. 24, 2015; 33 Pages.

Zhao et al., "Amorphous In—Ga—Zn—O thin-film transistor active pixel sensor x-ray imager for digital breast tomosynthesis", Medical Physics, vol. No. 41, Issue No. 9, Sep. 1, 2014.

International Search Report and Written Opinion issued in connection with corresponding PCT Application No. PCT/US2017/024851 dated Jun. 9, 2017.

* cited by examiner

PROCESSES FOR FABRICATING ORGANIC X-RAY DETECTORS, RELATED ORGANIC X-RAY DETECTORS AND SYSTEMS

CROSS REFERENCE TO RELATED APPLICATIONS

This application is a continuation-in-part of U.S. patent application Ser. No. 14/949,972 entitled "PROCESSES FOR FABRICATING ORGANIC X-RAY DETECTORS, RELATED X-RAY DETECTORS AND SYSTEMS," filed on 24 Nov. 2015, which is incorporated herein by reference in its entirety.

BACKGROUND

Embodiments of the present disclosure generally relate to organic x-ray detectors. More particularly, embodiments of the present disclosure relate to processes for fabricating organic x-ray detectors.

Digital x-ray detectors fabricated with continuous photodiodes have potential applications for low cost digital radiography as well as for rugged, light-weight and portable detectors. Digital x-ray detectors with continuous photodiodes have an increased fill factor and potentially higher quantum efficiency. The continuous photodiodes generally include organic photodiodes (OPDs). A scintillator material which converts x-ray to visible light is generally disposed on top of the OPD. The scintillator material may be applied on the OPD in the form of a sheet laminated to the OPD, in the form of a screen laminated to the OPD, or in the form of a layer deposited on the OPD. While the performance and efficacy of these organic x-ray detectors may improve when a scintillator layer is deposited on the OPD by a deposition technique, a potential limitation may be stability and reliability of OPD layers under deposition conditions.

Therefore, alternative processes for fabricating the organic x-ray detectors are desirable.

BRIEF DESCRIPTION

One aspect of the specification presents a process for fabricating an organic x-ray detector. The process includes forming a layered structure that includes disposing a first electrode layer on a thin film transistor array, disposing an organic photoactive layer on the first electrode layer and disposing a second electrode layer on the organic photoactive layer. The organic photoactive layer includes a fullerene or a fullerene derivative having a carbon cluster of at least 70 carbon atoms. The process further includes disposing a scintillator layer on the layered structure at a temperature greater than 50 degrees Celsius.

In one aspect of the specification, an organic x-ray detector fabricated by the process is provided. One aspect presents an x-ray system including the organic x-ray detector.

In one aspect of the specification, a process for fabricating an organic x-ray detector includes forming a layered structure that includes disposing a first electrode layer on a thin film transistor array, disposing an organic photoactive layer on the first electrode layer and disposing a second electrode layer on the organic photoactive layer. The organic photoactive layer includes a fullerene or a fullerene derivative having a carbon cluster of 70 carbon atoms. The process further includes disposing a scintillator layer on the layered structure at a temperature in a range from about 90 degrees Celsius to about 150 degrees Celsius. The scintillator layer includes thallium doped cesium iodide.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
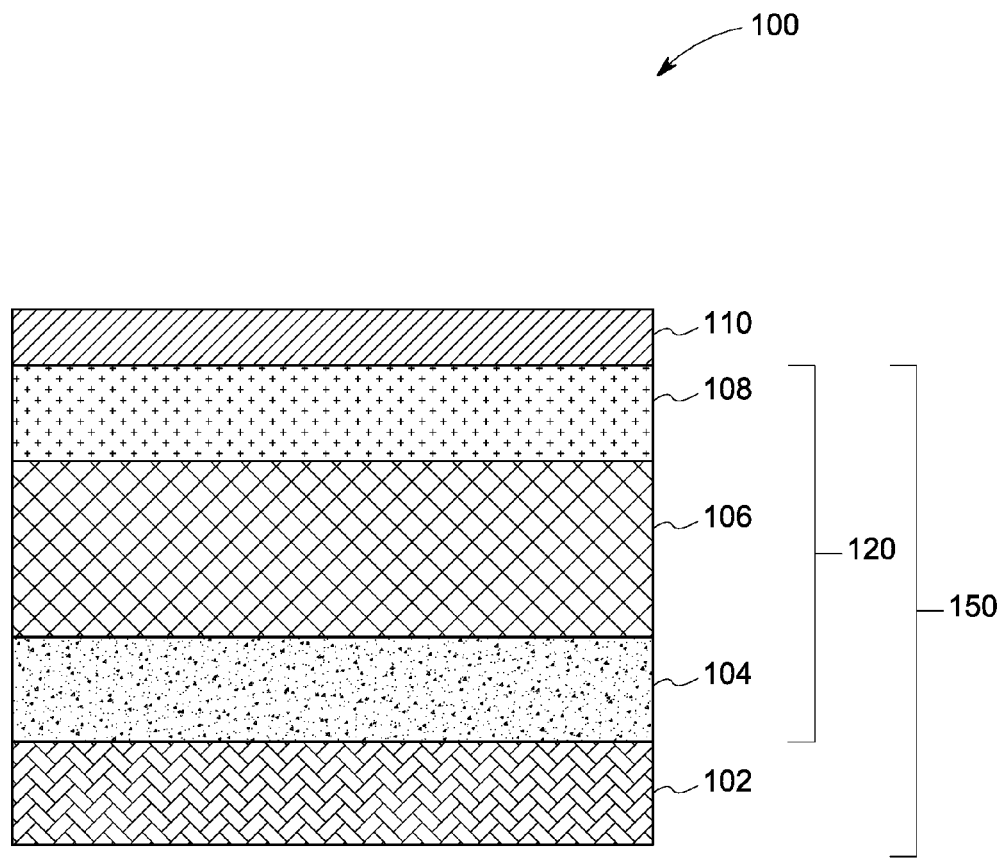
FIG. 1 is a schematic of an organic x-ray detector, in accordance with one embodiment of the invention.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

Unless defined otherwise, technical and scientific terms used herein have the same meaning as is commonly understood by one of skill in the art to which this invention belongs. The terms "comprising," "including," and "having" are intended to be inclusive, and mean that there may be additional elements other than the listed elements. The terms "first", "second", and the like, as used herein do not denote any order, quantity, or importance, but rather are used to distinguish one element from another.

As used herein, the term "layer" refers to a material disposed on at least a portion of an underlying surface in a continuous or discontinuous manner Further, the term "layer" does not necessarily mean a uniform thickness of the disposed material, and the disposed material may have a uniform or a variable thickness. As used herein, the term "disposed on" refers to layers disposed directly in contact with each other or indirectly by having intervening layers therebetween, unless otherwise specifically indicated.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

As used herein, the terms "photoactive layer" and "organic photoactive layer" refer to an organic layer that is capable of generating electric charges in response to or controlled by incident electromagnetic radiation. The organic photoactive layer may also be referred to as an organic photoelectric layer. In some embodiments, the organic photoactive layer may be a bulk, hetero-junction organic photodiode layer that absorbs light, generates electron-hole pairs (excitons), separates electric charges (holes and electrons) upon exciton dissociation, and transports electric charge to the opposing contact layers (electrode layers). In some embodiments, the organic photoactive layer comprises at least one donor material and at least one acceptor material.

Some embodiments of the present disclosure are directed to a process for fabricating an organic x-ray detector. The process includes forming a layered structure that includes disposing a first electrode layer on a thin film transistor array, disposing an organic photoactive layer on the first electrode layer, and disposing a second electrode layer on the organic photoactive layer. The organic photoactive layer includes a fullerene or a fullerene derivative having a carbon cluster of at least 70 carbon atoms. The process further includes disposing a scintillator layer on the layered structure at a temperature greater than 50 degrees Celsius.

In some embodiments, the process for fabricating an organic x-ray detector 100 is described with reference to FIGS. 1-2. The organic x-ray detector 100 includes a layered structure 150 and a scintillator layer 110 disposed on the layered structure 150. The layered structure 150 may also be referred to as "x-ray imager", and these terms may be used interchangeably throughout the specification.

Figure 2:
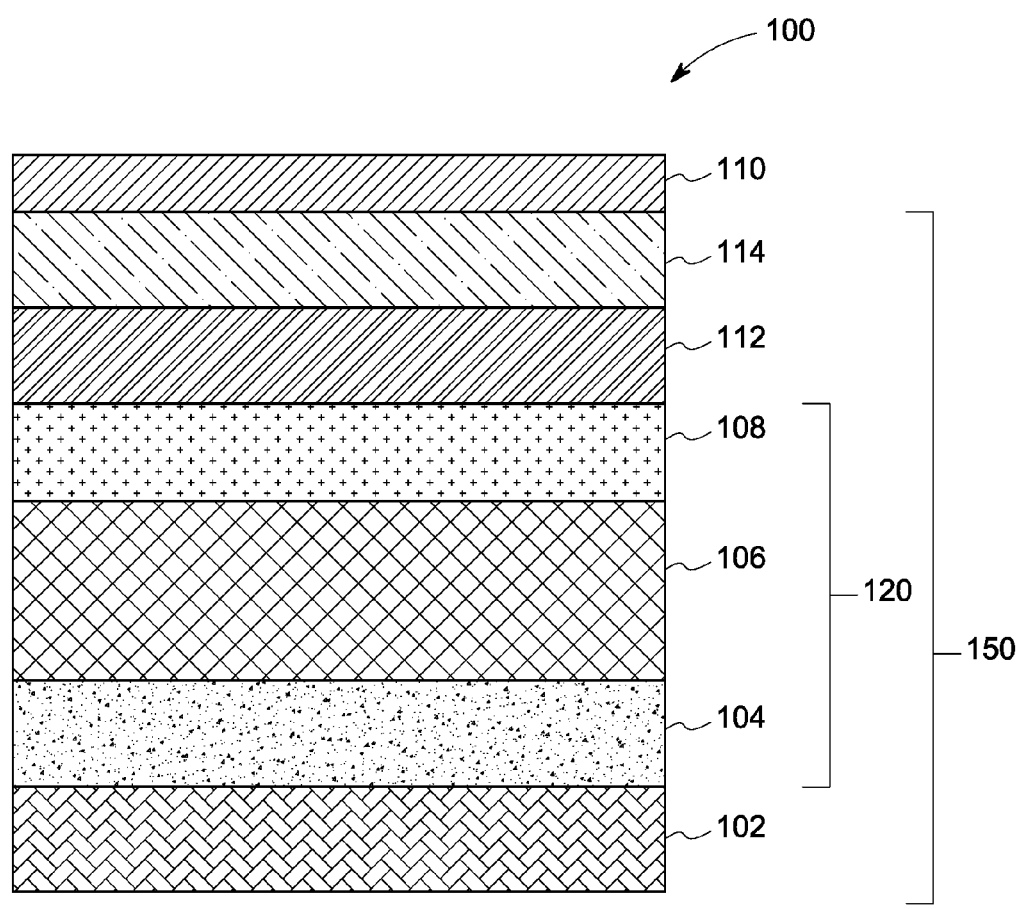
FIG. 2 is a schematic of an organic x-ray detector, in accordance with one embodiment of the invention.

In some embodiments, as depicted in FIGS. 1-2, the layered structure 150 includes a first electrode layer 104 disposed on a thin-film transistor (TFT) array 102, an organic photoactive layer 106 disposed on the first electrode layer 104, and a second electrode layer 108 disposed on the organic photoactive layer 106. In some embodiments, the organic photoactive layer 106 may be patterned. The first electrode layer 104, the organic photoactive layer 106, and the second electrode layer 108 may form an organic photodiode 120 disposed on the TFT array 102. The organic photodiode 120 may be directly disposed on the TFT array 102, or the organic x-ray detector 100 may include one or more layers disposed between the organic photodiode 120 and the TFT array 102.

Further, depending on the application and variations in design, the organic photodiode 120 may include a single organic layer or may include multiple organic layers. In some embodiments, the organic photodiode 120 may further include one or more charge blocking layers, for example, an electron blocking layer and a hole blocking layer (not shown in Figures). In some embodiments, an electron blocking layer may be disposed between the first electrode layer 104 and the organic photoactive layer 106. In some embodiments, a hole blocking layer may be disposed between the organic photoactive layer 106 and the second electrode layer 108.

The performance of an organic photodiode and an organic x-ray detector (for example, as depicted in FIGS. 1-2) may depend on the charge generation and charge transport within an organic photoactive layer. An efficient charge generation and charge transport from an organic photoactive layer may depend on various parameters such as materials used in the organic photoactive layer, the morphology and the thickness of the organic photoactive layer and materials used for the first electrode and the second electrode layers.

Referring to FIGS. 1-2, the organic photoactive layer 106 may include a blend of a donor material and an acceptor material. In some embodiments, more than one donor or acceptor may be included in the blend. Further, the HOMO/LUMO levels of the donor and acceptor materials may be compatible with that of the first and second electrode layers (104, 108) in order to allow efficient charge extraction without creating an energetic barrier.

As used herein, the terms "donor material", "donor phase" and "donor" may be used interchangeably throughout the specification; and the terms "acceptor material", "acceptor phase" and "acceptor" may be used interchangeably throughout the specification.

Suitable donor materials include low bandgap polymers having LUMO ranging from about 1.9 eV to about 4.9 eV and HOMO ranging from about 2.9 eV to about 7 eV. In some embodiments, the donor material has LUMO in a range from 2.5 eV to 4.5 eV, and in certain embodiments, from 3.0 eV to 4.5 eV. In some embodiments, the donor material has HOMO in a range from 4.0 eV to 6 eV, and in certain embodiments, from 4.5 eV to 6 eV. In some embodiments, the donor material has HOMO greater than or equal to 5.0 eV. The low band gap polymers include conjugated polymers and copolymers composed of units derived from substituted or unsubstituted monoheterocyclic and polyheterocyclic monomers such as thiophene, fluorene, phenylenvinylene, carbazole, pyrrolopyrrole, and fused heteropolycyclic monomers containing the thiophene ring, including, but not limited to, thienothiophene, benzodithiophene, benzothiadiazole, pyrrolothiophene monomers, and substituted analogs thereof. In some embodiments, the low band gap polymers include units derived from substituted or unsubstituted thienothiophene, benzodithiophene, benzothiadiazole, carbazole, isothianaphthene, pyrrole, benzo-bis(thiadiazole), thienopyrazine, fluorene, thiadiazolequinoxaline, or combinations thereof. In the context of the low band gap polymers described herein, the term "units derived from" means that the units include monoheterocyclic and polyheterocyclic group, without regard to the substituents present before or during the polymerization; for example, "the low band gap polymers include units derived from thienothiophene" means that the low band gap polymers include divalent thienothiophenyl groups. Examples of suitable materials for use as low bandgap polymers in the organic x-ray detectors, in some embodiments, include copolymers derived from substituted or unsubstituted thienothiophene, benzodithiophene, benzothiadiazole, carbazole monomers, or combinations thereof, such as poly[[4,8-bis[(2-ethylhexyl)oxy]benzo[1,2-b:4,5-b']dithiophene-2,6-diyl][3-fluoro-2-[(2-ethylhexyl)carbonyl] thieno[3,4-b]thiophenediyl (PTB7); 2,1,3-benzothiadiazole-4,7-diyl[4,4-bis(2-ethylhexyl)-4H-cyclopenta[2,1-b:3,4-b']dithiophene-2,6-diyl (PCPDTBT); poly[[9-(1-octylnonyl)-9H-carbazole-2,7-diyl]-2,5-thiophenediyl-2,1,3-benzothiadiazole-4,7-diyl-2,5-thiophenediyl] (PCDTBT); poly[(4,40-bis(2-ethylhexyl) dithieno [3,2-b:20,30-d]silole)-2,6-diyl-alt-(2,1,3-benzothiadiazole)-4,7-diyl] (PSBTBT); poly((4,8-bis(octyloxy) benzo(1,2-b:4,5-b')dithiophene-2,6-diyl)(2-((dodecyloxy) carbonyl) thieno(3,4-b)thiophenediyl)) (PTB1); poly((4,8-bis(octyloxy)benzo(1,2-b:4,5-b')dithiophene-2,6-diyl)(2-((ethylhexyloxy)carbonyl) thieno(3,4-b)thiophenediyl)) (PTB2); poly((4,8-bis(octyl)benzo(1,2-b:4,5-b')dithiophene-2,6-diyl) (2-((ethylxyloxy)carbonyl) thieno(3,4-b) thiophenediyl)) (PTB3); poly((4,8-bis-(ethylhexyloxybenzo (1,2-b:4,5-b')dithiophene-2,6-diyl)(2-((octyloxy)carbonyl)-3-fluoro)thieno(3,4-b)thiophenediyl)) (PTB4); poly((4,8-bis (ethylhexyloxybenzo(1,2-b:4,5-b')dithiophene-2,6-diyl)(2-((octyloxy)carbonyl) thieno(3,4-b)thiophenediyl)) (PTB5); poly((4,8-bis(octyloxy)benzo(1,2-b:4,5-b')dithiophene-2,6-diyl)(2-((butyloctyloxy)carbonyl) thieno(3,4-b)thiophenediyl)) (PTB6); poly[[5-(2-ethylhexyl)-5,6-dihydro-4,6-dioxo-4H-thieno[3,4-c]pyrrole-1,3-diyl][4,8-bis[(2-ethylhexyl)oxy]benzo [1,2-b:4,5-b']dithiophene-2,6-diyl]] (PBDTTPD); poly[1-(6-{4,8-bis[(2-ethylhexyl)oxy]-6-methylbenzo[1,2-b:4,5-b']dithiophen-2-yl}-3-fluoro-4-methylthieno[3,4-b]thiophen-2-yl)-1-octanone] (PBDTTT-CF); or poly[2,1,3-benzothiadiazole-4,7-diyl-2,5-thiophenediyl (9,9-dioctyl-9H-9-silafluorene-2,7-diyl)-2,5-thiophenediyl] (PSiF-DBT). Other suitable materials include poly[5,7-bis (4-decanyl-2-thienyl) thieno[3,4-b] diathiazole-thiophene-2,5] (PDDTT); poly[2,3-bis(4-(2-ethylhexyloxy)phenyl)-5,7-di(thiophen-2-yl)thieno[3,4-b] pyrazine] (PDTTP); or polythieno[3,4-b]thiophene (PTT). In certain embodiments, suitable materials are copolymers derived from substituted or unsubstituted benzodithiophene monomers, such as the PTB1-7 series and PCPDTBT; or benzothiadiazole monomers, such as PCDTBT and PCP-DTBT.

In some embodiments, the acceptor material includes a fullerene or a fullerene derivative having a carbon cluster of at least 70 carbon atoms. Suitable examples include phenyl-C-butyric-acid-methyl ester (PCBM) analogs such as phenyl-$C_{71}$-butyric-acid-methyl ester ($PC_{70}BM$), phenyl-$C_{85}$-butyric-acid-methyl ester ($PC_{84}BM$), bis-adducts thereof, such as bis-$PC_{71}BM$, or indene mono-adducts thereof. In certain embodiments, the acceptor material includes $PC_{70}BM$. Some other examples of acceptor materials include poly[(9,9-dioctylfluorenyl-2,7-diyl)-alt-(4,7-bis(3-hexylthiophen-5-yl)-2,1,3-benzothiadiazole)-2',2"-diyl] (F8TBT) that may also be used with the fullerene or the fullerene derivative.

The organic photoactive layer 106 may have a thickness in a range from about 0.05 micron to about 5 microns. In some embodiments, the thickness of the organic photoactive layer is in a range from about 0.1 micron to about 0.5 micron. In some other embodiments, the thickness of the organic photoactive layer is greater than 0.5 micron. In some embodiments, the thickness is in a range from about 0.5 micron to about 3 microns. In some embodiments, the thickness is in a range from about 0.7 micron to about 2 microns.

In one embodiment, the first electrode layer 104 functions as a cathode and the second electrode layer 108 as an anode. In another embodiment, the first electrode layer 104 functions as an anode and the second electrode layer 108 as a cathode. Suitable anode materials include, but are not limited to, metals such as Al, Ag, Au, and Pt; metal oxides such as indium tin oxide (ITO), indium zinc oxide (IZO), and zinc oxide (ZnO); and organic conductors such as p-doped conjugated polymers like poly(3,4-ethylenedioxythiophene) (PEDOT). Suitable cathode materials include transparent conductive oxides (TCO) and thin films of metals such as gold and silver. Examples of suitable TCO include ITO, IZO, aluminum zinc oxide (AZO), fluorinated tin oxide (FTO), tin oxide ($SnO_2$), titanium dioxide ($TiO_2$), ZnO, indium zinc oxide (In—Zn—O series), indium gallium oxide, gallium zinc oxide, indium silicon zinc oxide, indium gallium zinc oxide, or combinations thereof.

The TFT array 102 may be a two dimensional array of passive or active pixels, which stores charge for read out by electronics, disposed on a layer formed of amorphous silicon, poly-crystalline silicon, an amorphous metal oxide, or organic semiconductors. In some embodiments, the TFT array includes a silicon TFT array, an oxide TFT array, an organic TFT, or combinations thereof. Suitable examples of the amorphous metal oxides include zinc oxide, zinc tin oxide, indium oxides, indium zinc oxides (In—Zn—O series), indium gallium oxides, gallium zinc oxides, indium silicon zinc oxides, and indium gallium zinc oxides (IGZO). IGZO materials include $InGaO_3(ZnO)_m$ where m is <6 and $InGaZnO_4$. Suitable examples of the organic semiconductors for the TFT array include, but are not limited to, conjugated aromatic materials, such as rubrene, tetracene, pentacene, perylenediimides, tetracyanoquinodimethane and polymeric materials such as polythiophenes, polybenzodithiophenes, polyfluorene, polydiacetylene, poly(2,5-thiophenylene vinylene), poly(p-phenylene vinylene), and derivatives thereof.

The TFT array 102 may be disposed on a substrate (not shown). Suitable substrate materials include glass, ceramics, plastics, metals or combinations thereof. The substrate may be present as a rigid sheet such as a thick glass, a thick plastic sheet, a thick plastic composite sheet, and a metal plate; or a flexible sheet, such as, a thin glass sheet, a thin plastic sheet, a thin plastic composite sheet, and metal foil. Examples of suitable materials for the substrate include glass, which may be rigid or flexible; plastics such as polyethylene terephthalate, polybutylene phthalate, polyethylene naphthalate, polystyrene, polycarbonate, polyether sulfone, polyallylate, polyimide, polycycloolefin, norbornene resins, and fluoropolymers; metals such as stainless steel, aluminum, silver and gold; metal oxides such as titanium oxide and zinc oxide; and semiconductors such as silicon. In certain embodiments, the substrate includes a polycarbonate.

Referring to FIGS. 1-2 again, the scintillator layer 110 generates light that irradiates the organic photodiode 120. In some embodiments, the scintillator layer 110 is excited by impinging x-ray radiation, and generates visible light.

The scintillator layer 110 may include a phosphor material that is capable of converting x-rays to visible light. These phosphor materials may also be referred to as scintillator materials, and these terms may be used interchangeably throughout the specification. The wavelength region of light emitted by scintillator layer 110 may range from about 360 nanometers (nm) to about 830 nm. Suitable materials for the scintillator layer 110 include, but are not limited to, cesium iodide (CsI), thallium doped cesium iodide (CsI:Tl), terbium doped gadolinium oxysulfide, sodium iodide (NaI), lutetium oxides ($Lu_xO_y$) or combinations thereof. In certain embodiments, the scintillator layer 110 includes thallium doped cesium iodide. Thallium doped cesium iodide generally has higher conversion efficiency than other materials.

In some embodiments, the layered structure 150 may further include one or more layers disposed on the second electrode layer 108, for example a planarization layer and a barrier layer. FIG. 2 illustrates an embodiment of an organic x-ray detector 100 wherein a planarization layer 112 and a barrier layer 114 are interposed between the second electrode layer 108 and the scintillator layer 110. As illustrated, the planarization layer 112 is disposed on the second electrode 108, and the barrier layer 114 is disposed on the planarization layer 112.

The planarization layer 112 may provide a smooth surface on the layered structure 150 prior to the disposition of the scintillator layer 110. Non-limiting examples of materials for the planarization layer 112 include a polyimide, an acrylate, or a low solvent content silicone.

The barrier layer 114 may include an inorganic material. In some embodiments, the barrier layer 114 may include silicon, a metal oxide, a metal nitride, or combinations thereof, where the metal is one of indium, tin, zinc, titanium, and aluminum. Non-limiting examples of metal nitrides and metal oxides include indium zinc oxide (IZO), indium tin oxide (ITO), silicon oxide, silicon nitride, silicon oxynitride, aluminum oxide, aluminum oxynitride, zinc oxide, indium oxide, tin oxide, cadmium tin oxide, cadmium oxide, magnesium oxide, or combinations thereof.

In some embodiments, a process for fabricating an organic x-ray detector 100 (as shown in FIGS. 1-2) is described. As will be apparent to one of ordinary skill in the art, the fabrication process for the organic x-ray detector 100 may include several steps, and the disposition of the scintillator layer 110 may be performed after performing one or more of the fabrication steps.

Figure 3:
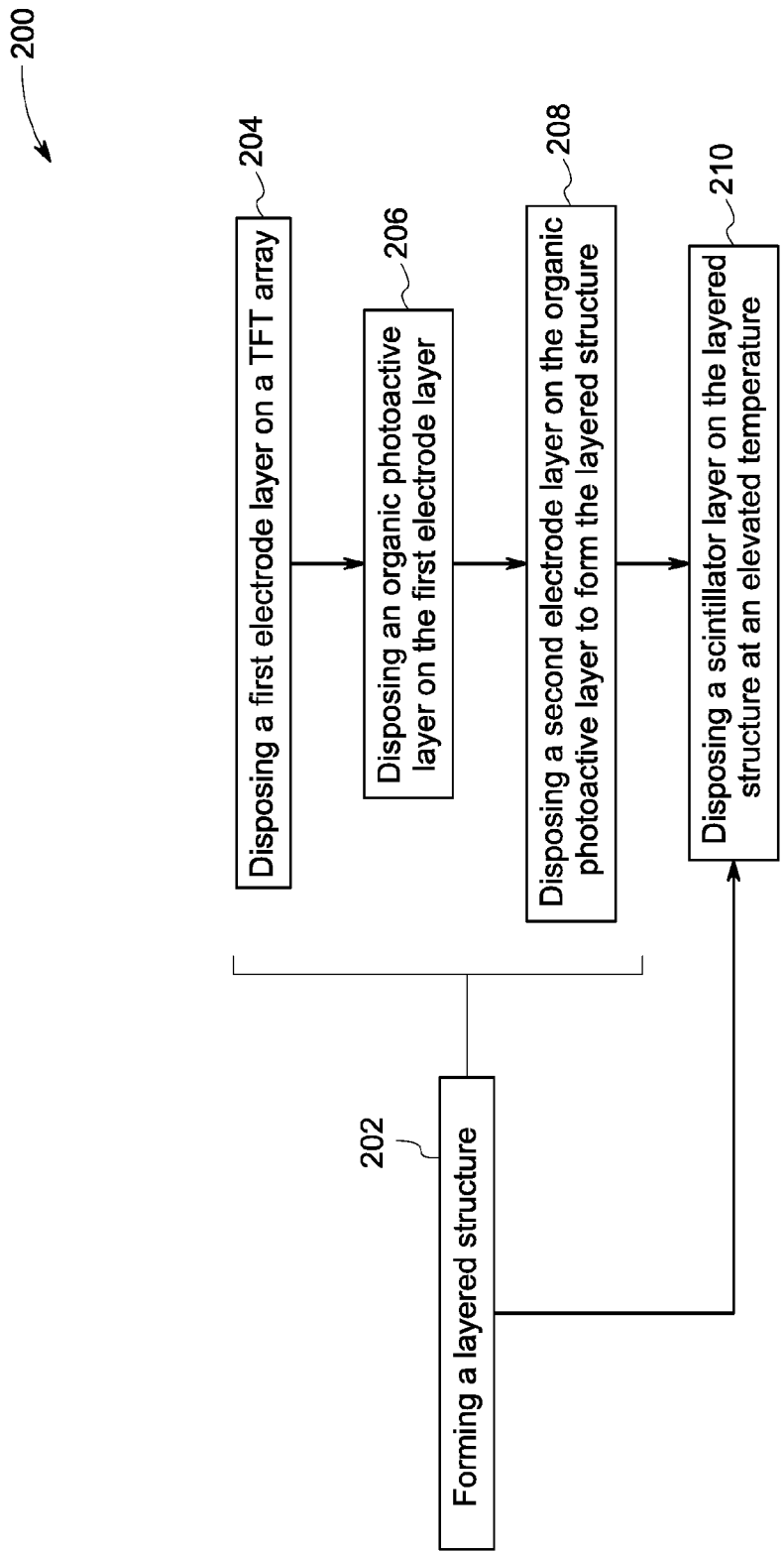
FIG. 3 is a flow chart of a process for fabricating an organic x-ray detector, in accordance with one embodiment of the invention.
Figure 4:
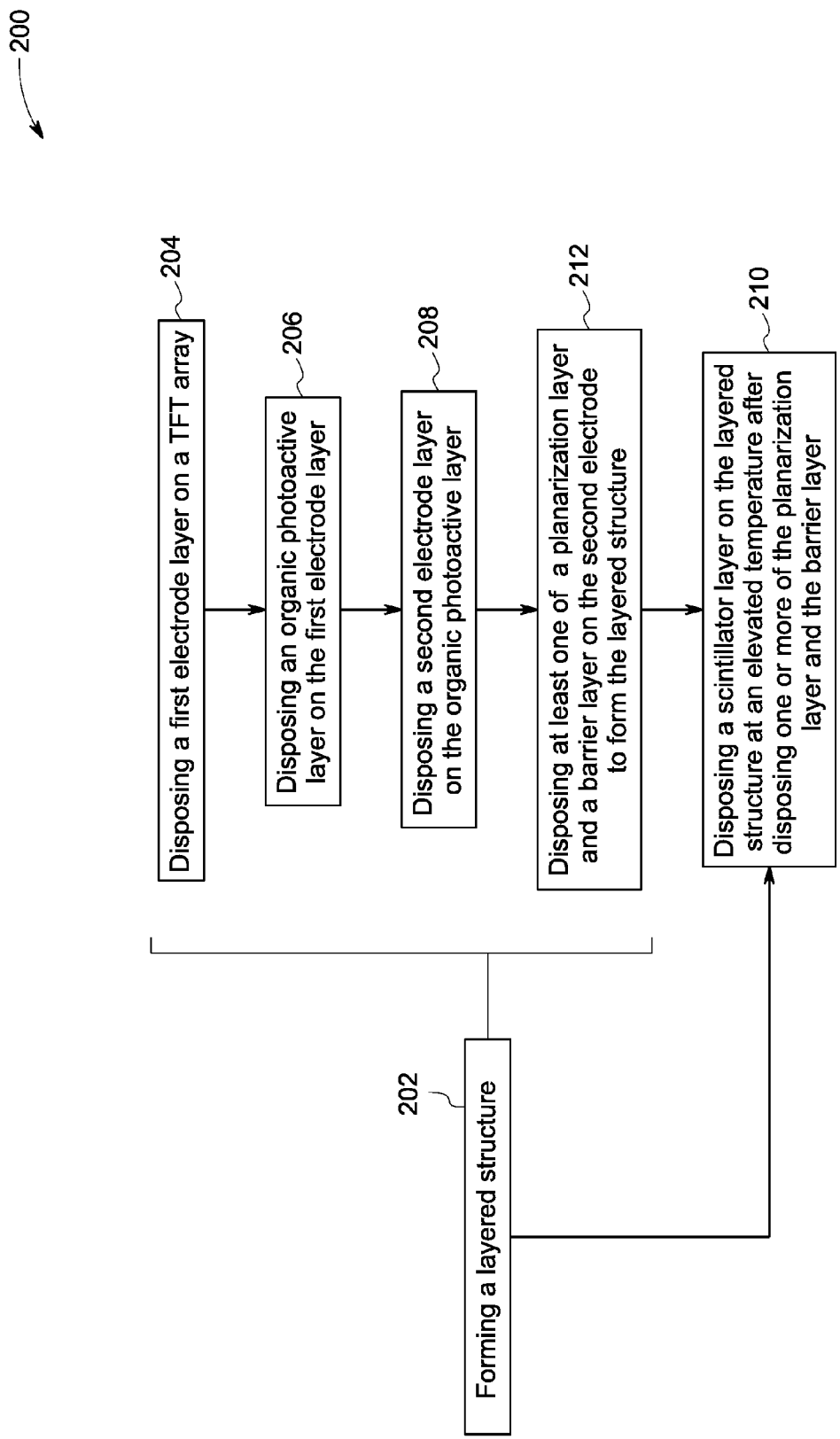
FIG. 4 is flow chart of a process for fabricating an organic x-ray detector, in accordance with one embodiment of the invention.

FIGS. 3-4 depict flow charts of a process 200 for fabricating the organic x-ray detector 100 (as shown in FIGS. 1-2) according to some embodiments. Referring now to FIGS. 1 and 3, in some embodiments, the process 200 includes the step 202 of forming the layered structure 120. In some embodiments, the step 202 of forming the layered structure 120 includes the step 204 of disposing a first electrode layer 104 on a TFT array 102 by any suitable technique, such as sputtering, vapor deposition, or e-beam deposition. The forming step 202 further includes the step 206 of disposing an organic photoactive layer 106 on the first electrode layer 104. In some embodiments, an optional electron blocking layer (not shown in Figures) may be deposited on the first electrode layer 104 before disposing the organic photoactive layer 106, by a suitable technique. In embodiments where the electron blocking layer is disposed on the first electrode layer 104, the organic photoactive layer 106 is disposed on the electron blocking layer. In some embodiments, the organic photoactive layer 106 is disposed using any suitable method, for example solution based deposition methods. Non-limiting examples of the deposition methods for disposing the organic photoactive layer 106 may include one or more of solvent casting, spin coating, dip coating, spray coating, slot-die coating, blade coating or any other solution based methods. Following the deposition of the organic photoactive layer 106, the step 206 may optionally include curing the organic photoactive layer 106 to remove a solvent used while disposing the organic photoactive layer by a solution based method. In some embodiments, the step of curing of the organic photoactive layer 106 is carried out at a temperature in a range from about 50 degrees Celsius to about 300 degrees Celsius for at least 10 minutes.

The forming step 202 may further include the step 208 of disposing a second electrode layer 108 on the organic photoactive layer 106, and thereby forming the layered structure 150. The second electrode layer 108 may be disposed by a suitable deposition technique, such as thermal evaporation, sputtering and direct printing. In some embodiments, the forming step 202 may include the step of disposing a hole blocking layer (not shown in Figures). In embodiments where the hole blocking layer is disposed on the organic photoactive layer 106 prior to the step of disposing the second electrode layer 108, the second electrode layer 108 is disposed directly on the hole blocking layer.

In some embodiments, the process 200, as shown in FIG. 4, may further include the step 212 of disposing at least one of a planarization layer 112 and a barrier layer 114 on the second electrode 108 to form the layered structure 150. In some embodiments, the step 212 includes disposing the planarization layer 112 on the second electrode 108. In some embodiments, the step 212 further includes disposing the barrier layer 114 on the planarization layer 112 (as shown in FIG. 2).

The process 200 further includes the step 210 of disposing a scintillator layer 110 on the layered structure 150. In some embodiments, the scintillator layer 110 may be disposed by depositing a suitable scintillator material on the layered structure 150. The step 210 of disposing the scintillator layer 110 may be performed at a temperature greater than 50 degrees Celsius. Suitable techniques for disposing the scintillator layer 110 include physical vapor deposition (PVD) such as thermal evaporation technique or thermal lamination of scintillator material pre-deposited onto a separate substrate (for example, plastics).

In certain embodiments, the step 210 of disposing the scintillator layer 110 is performed using a physical vapor deposition technique at a temperature greater than 50 degrees Celsius. The deposition step 210 may be carried out in a deposition chamber heated to a desired temperature. In some embodiments, the step 210 of disposing the scintillator layer is performed at a temperature greater than 70 degrees Celsius. In some embodiments, the step 210 of disposing the scintillator layer is performed at a temperature in a range from about 70 degrees Celsius to about 180 degrees Celsius. In certain embodiments, the step 210 of disposing the scintillator layer is performed at a temperature in a range from about 90 degrees Celsius to about 150 degrees Celsius.

In embodiments where at least one of the planarization layer 112 and the barrier layer 114 is disposed on the second electrode layer 108, the step 210 of disposing the scintillator layer 110 may be performed after the step 212 of disposing one or both of the planarization layer 112 and the barrier layer 114, as illustrated in flow chart of FIG. 4. In some embodiments, the step 210 of disposing the scintillator layer 110 may be performed after the step of disposing the planarization layer 112. In embodiments where the step 212 includes disposing the planarization layer 112 and the barrier layer 114, the step 210 of disposing the scintillator layer 110 is performed after the step of disposing the barrier layer 114.

In some embodiments, the step 210 of disposing the scintillator layer 110 may include disposing the scintillator layer 110 directly on the layered structure 150. As used herein, the term "disposing the scintillator layer directly on the layered structure" refers to disposing the scintillator layer 110 in direct contact with a top surface of the layered structure 150. In some embodiments, the step 210 of disposing a scintillator layer 110 includes disposing the scintillator layer 110 directly on the second electrode layer 108, as shown in FIG. 1. In these embodiments, the scintillator layer 110 is disposed in direct contact with the second electrode 108. In embodiments where the layered structure 150 includes at least one of the planarization layer 112 and the barrier layer 114, the step 210 of disposing the scintillator layer includes disposing the scintillator layer 110 directly (in direct contact) on one of the planarization layer 112 or the barrier layer 114. FIG. 3 illustrates embodiments where the scintillator layer 110 is disposed directly on the barrier layer 114.

In typical organic x-ray detector manufacturing methods, a scintillator layer pre-deposited on a substrate is laminated on a layered structure. As discussed previously, deposition of scintillator materials on the layered structure may improve the performance of the organic x-ray detector. However, deposition of some scintillator materials, for example thallium doped cesium iodide, is generally performed by a thermal evaporation technique at a temperature greater than 50 degrees Celsius, which may result in performance degradation of the organic x-ray detector. Without being bound by any theory, it is believed that the degradation in the performance of the organic x-ray detector may be attributed to the thermal instability of the materials used for the organic photodiode layers at these deposition temperatures (i.e., temperatures greater than 50 degrees Celsius)

Some embodiments of the present disclosure, thus, advantageously provide a process for fabricating an organic x-ray detector by depositing a scintillator layer at a temperature greater than 50 degrees Celsius. According to some embodiments, the organic photoactive layer includes a fullerene or a fullerene derivative having a carbon cluster of at least 70 carbon atoms. These materials (for example, $PC_{70}BM$) have high thermal stability at temperatures greater than 50 degrees Celsius. Using such fullerene or fullerene derivatives in the organic photoactive layer allows for the disposition of scintillator materials (for example, thallium doped cesium iodide) at temperatures greater than 50 degrees Celsius, which helps in attaining improved performance of the resulting organic x-ray detector.

Figure 5:
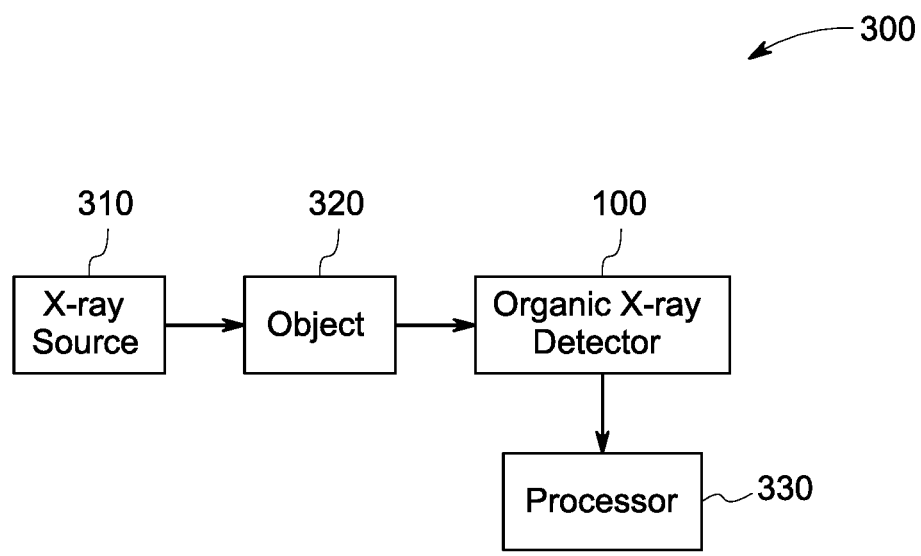
FIG. 5 is schematic of an x-ray system, in accordance with one embodiment of the invention.

In some embodiments, an x-ray system is also presented. In some embodiments, the x-ray system may include an x-ray imaging system. As shown in FIG. 5, the x-ray system 300 includes an x-ray source 310 configured to irradiate an object 320 with x-ray radiation; an organic x-ray detector 100 as described earlier, and a processor 330 operable to process data from the organic x-ray detector 100.

An organic x-ray detector according to some embodiments of the present disclosure may be used in imaging systems, for example, in conformal imaging, with the organic x-ray detector in intimate contact with the imaging surface. For parts with internal structure, the organic x-ray detector may be rolled or shaped to contact the part being imaged. Applications for the organic x-ray detectors according to some embodiments of the present disclosure include security imaging; medical imaging; and industrial and military imaging for pipeline, fuselage, airframe and other tight access areas.

EXAMPLES

Example 1

Fabrication of Organic X-Ray Detectors (OXRDs)

Four blends were prepared in the nitrogen glove box by dissolving a donor polymer with an acceptor material ($PC_{60}BM$ or $PC_{70}BM$) using the weight ratios given in Table 1 into chlorobenzene.

A thin film transistor (TFT) substrate having a TFT array pre-coated with an indium titanium oxide (ITO) anode layer was used as a substrate, where the ITO anode layer is connected to a source and a drain of the TFT. A proprietary electron blocking layer was coated atop the ITO anode layer of the TFT substrate. A photoactive layer composed of a blend (prepared as discussed above) was then spin-coated onto the organic electron blocking layer inside a $N_2$ purged glove box, followed by baking for 1 hour at about 75 degrees Celsius. An ITO cathode layer was deposited by sputtering on the photoactive layer. Fabrication of an OXRD was completed with a scintillator layer application on the ITO cathode layer. A 550 microns thick layer of CsI:Tl was deposited on the ITO cathode layer by thermal evaporation technique at 90 degrees Celsius.

Four OXRDs 1-4 were fabricated according to the process as described above by using corresponding four blends (Table 1) to form photoactive layers of thicknesses as given in Table 1.

TABLE 1

Materials and fabrication details of photoactive layers for OXRDs 1-4

| OXRD | Acceptor material in the blend | (Donor:Acceptor ratio in the blend) (weight ratio) | Thickness (nm) |
|---|---|---|---|
| 1 | $PC_{60}BM$ | 1:1 | 518 |
| 2 | $PC_{60}BM$ | 1:2 | 527 |
| 3 | $PC_{70}BM$ | 1:1 | 473 |
| 4 | $PC_{70}BM$ | 1:2 | 544 |

Example 2

Testing of X-Ray Imagers

Performance of an OXRD was predetermined based on the performance of the corresponding x-ray imager (layered structure). Four x-ray imagers corresponding to the four OXRDs were tested.

Performance of four x-ray imagers corresponding to the four OXRDs were first characterized using an imager functional tester before the CsI:Tl layer deposition. In order to study change in performance of the x-ray imagers due to the deposition of CsI:Tl layers at a temperature 90 degrees Celsius, the CsI:Tl layers were removed by rinsing the CsI:Tl layers with water from the OXRDs. Performance of the four x-ray imagers after removing CsI:Tl layers were characterized again. Table 2 shows quantum efficiencies (QEs) of the four x-ray imagers before CsI:Tl layer deposition, and after performing CsI:Tl layer deposition and removal steps.

TABLE 2

Performance of x-ray imagers

| x-ray imager | QE (%) before CsI:Tl layer deposition | QE (%) after performing CsI:Tl layer deposition and removal steps |
|---|---|---|
| 1 | 105 | 96 |
| 2 | 125 | 97 |
| 3 | 99 | 130 |
| 4 | 123 | 137 |

The x-ray imagers 1-4 showed comparable QEs before CsI:Tl layer deposition. However, x-ray imagers 1 and 2 that included a $PC_{60}BM$-based photoactive layer showed significantly reduced QEs after performing CsI:Tl layer deposition and removal steps (that is after exposing the x-ray imagers to the deposition temperature i.e., 90 degrees Celsius) as compared to that of the x-ray imagers 3 and 4 that included a $PC_{70}BM$-based photoactive layer. These results clearly imply that the use of $PC_{70}BM$ in an organic phoactive layer in an organic photodiode allows for the deposition of scintillator materials (for example, CsI:Tl) by a deposition technique at a temperature greater than 50 degrees Celsius on the organic photodiode to form an organic x-ray detector (OXRD).

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for fabricating an organic x-ray detector, the process comprising:
   forming a layered structure, comprising:
      disposing a first electrode layer on a thin film transistor array;
      disposing an organic photoactive layer on the first electrode layer, wherein the organic photoactive layer comprises a fullerene or a fullerene derivative comprising a carbon cluster of at least 70 carbon atoms;
      disposing a second electrode layer on the organic photoactive layer; and
   disposing a scintillator layer on the layered structure at a temperature about 90 degrees Celsius.

2. The process according to claim 1, wherein the scintillator layer comprises cesium iodide, thallium doped cesium iodide, terbium doped gadolinium oxysulfide, sodium iodide, lutetium oxides, or combinations thereof.

3. The process according to claim 1, wherein the step of disposing the scintillator layer is performed by a physical vapor deposition technique.

4. The process according to claim 1, wherein the step of disposing the scintillator layer comprises disposing the scintillator layer directly on the layered structure.

5. The process according to claim 1, wherein the step of forming the layered structure further comprises disposing at least one of a planarization layer and a barrier layer on the second electrode layer.

6. The process according to claim 1, wherein the organic photoactive layer comprises a fullerene or a fullerene derivative comprising a carbon cluster of 70 carbon atoms.

7. The process according to claim 6, wherein the fullerene or the fullerene derivative comprises phenyl-$C_{71}$-butyric-acid-methyl ester.

8. The process according to claim 1, wherein the organic photoactive layer further comprises a low bandgap polymer.

9. The process according to claim 8, wherein the low bandgap polymer comprises units derived from substituted or unsubstituted thienothiophene, benzodithiophene, benzothiadiazole, pyrrolothiophene, carbazole, or combinations thereof.

10. The process according to claim 1, wherein the organic photoactive layer has a thickness in a range from about 0.05 micron to about 5 microns.

11. The process according to claim 1, wherein the organic photoactive layer has a thickness in a range from about 0.5 micron to about 3 microns.

12. An organic x-ray detector fabricated by the process in accordance with claim 1.

13. An x-ray imaging system comprising the organic x-ray detector in accordance with claim 12.

14. A process for fabricating an organic x-ray detector, the process comprising:
   forming a layered structure, comprising:
      disposing a first electrode layer on a thin film transistor array;
      disposing an organic photoactive layer on the first electrode layer; wherein the organic photoactive layer comprises a fullerene or a fullerene derivative comprising a carbon cluster of 70 carbon atoms;
      disposing a second electrode layer on the organic photoactive layer; and
   disposing a scintillator layer on the layered structure at a temperature of about 90 degrees Celsius, wherein the scintillator layer comprises thallium doped cesium iodide.

* * * * *